US009818469B1

(12) United States Patent
Kim et al.

(10) Patent No.: US 9,818,469 B1
(45) Date of Patent: Nov. 14, 2017

(54) REFRESH CONTROL DEVICE AND SEMICONDUCTOR DEVICE INCLUDING THE SAME

(71) Applicant: SK hynix Inc., Icheon-si, Gyeonggi-do (KR)

(72) Inventors: Dae Suk Kim, Icheon-si (KR); Jae Il Kim, Yongin-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 15/361,172

(22) Filed: Nov. 25, 2016

(30) Foreign Application Priority Data

Sep. 5, 2016 (KR) .................. 10-2016-0113926

(51) Int. Cl.
| | |
|---|---|
| G11C 11/406 | (2006.01) |
| G11C 11/408 | (2006.01) |
| G11C 11/4096 | (2006.01) |
| G11C 11/4076 | (2006.01) |
| G06F 3/06 | (2006.01) |

(52) U.S. Cl.
CPC ...... *G11C 11/40615* (2013.01); *G06F 3/0619* (2013.01); *G06F 3/0659* (2013.01); *G06F 3/0673* (2013.01); *G11C 11/4076* (2013.01); *G11C 11/4087* (2013.01); *G11C 11/4096* (2013.01)

(58) Field of Classification Search
CPC .................................................. G11C 11/406
USPC ........................................................ 365/222
See application file for complete search history.

(56) References Cited

U.S. PATENT DOCUMENTS

| | | | |
|---|---|---|---|
| 9,093,173 B1 | 7/2015 | Cha | |
| 9,190,131 B2* | 11/2015 | Song | ..................... G11C 29/783 |
| 9,236,110 B2* | 1/2016 | Bains | ................ G11C 11/40618 |
| 9,299,400 B2* | 3/2016 | Bains | ..................... G11C 11/406 |
| 9,311,984 B1* | 4/2016 | Hong | ..................... G11C 11/406 |
| 9,431,092 B2* | 8/2016 | Lim | ....................... G11C 11/408 |
| 9,478,316 B1* | 10/2016 | Ryu | ....................... G11C 29/785 |
| 2016/0019940 A1 | 1/2016 | Jang et al. | |
| 2016/0125931 A1 | 5/2016 | Doo et al. | |
| 2016/0133314 A1 | 5/2016 | Hwang et al. | |

\* cited by examiner

*Primary Examiner* — Son Mai
(74) *Attorney, Agent, or Firm* — William Park & Associates Ltd.

(57) ABSTRACT

A refresh control device may include a command decoder configured to decode a command signal and a specific address, and output a refresh signal, an active signal and a row hammer refresh signal. The refresh control device may include a refresh controller configured to output an active address, a row hammer address and a refresh address based on the refresh signal, the active signal, the row hammer refresh signal and a latch address. The refresh control device may include a combiner configured to combine the active address, the row hammer address and the refresh address, and output a refresh control signal.

20 Claims, 7 Drawing Sheets

| Function | Abbreviation | CKE | | CS_n | ACT_n | RAS_n /A16 | CAS_n /A15 | WE_n /A14 | BG0- BG1 | BA0- BA1 | C2-C0 | A12/ BC_n | A17, A13, A11 | A10/ AP | A0-A9 | NOTE |
|---|---|---|---|---|---|---|---|---|---|---|---|---|---|---|---|---|
| | | Previous Cycle | Current Cycle | | | | | | | | | | | | | |
| REFRESH | REF | H | H | L | H | L | L | H | H | V | V | V | V | V | V | |

FIG. 3

| Function | Abbreviation | CKE | | CS_n | ACT_n | RAS_n /A16 | CAS_n /A15 | WE_n /A14 | BG0-BG1 | BA0-BA1 | C2-C0 | A12/ BC_n | A17, A13, A11 | A10/ AP | A0-A9 | NOTE |
|---|---|---|---|---|---|---|---|---|---|---|---|---|---|---|---|---|
| | | Previous Cycle | Current Cycle | | | | | | | | | | | | | |
| ROW HAMMER REFRESH | REF_RH | H | H | L | H | L | L | H | L | V | V | V | V | V | V | |

FIG. 4

REFRESH CONTROL DEVICE AND SEMICONDUCTOR DEVICE INCLUDING THE SAME

CROSS-REFERENCES TO RELATED APPLICATION

The present application claims priority under 35 U.S.C. §119(a) to Korean application number 10-2016-0113926, filed on Sep. 5, 2016, in the Korean Intellectual Property Office, which is incorporated herein by reference in its entirety.

BACKGROUND

1. Technical Field

Various embodiments may generally relate to a refresh control device and a semiconductor device including the same, and more particularly, to a technology related to preventing characteristic deterioration caused by row hammering.

2. Related Art

With the increase in integration density of memories, a pitch between word lines included in a memory has been reduced. The reduction of pitch between word lines has increased a coupling effect between adjacent word lines.

Whenever data is inputted to or outputted from a memory cell, a word line toggles between an active state and an inactive state. However, the above-described increase in coupling effect between adjacent word lines may damage the data of a memory cell coupled to a word line adjacent to a word line which is frequently activated.

Such a phenomenon is referred to as word line disturbance. This word line disturbance may damage the data of a memory cell before the memory cell can be refreshed.

SUMMARY

In an embodiment of the present disclosure, a refresh control device may be provided. The refresh control device may include a command decoder configured to decode a command signal and a specific address, and output a refresh signal, an active signal and a row hammer refresh signal. The refresh control device may include a refresh controller configured to output an active address, a row hammer address and a refresh address based on the refresh signal, the active signal, the row hammer refresh signal and a latch address. The refresh control device may include a combiner configured to combine the active address, the row hammer address and the refresh address, and output a refresh control signal.

In an embodiment of the present disclosure, a semiconductor device may be provided. The semiconductor device may include a refresh control device configured to decode a command signal to output a refresh signal, an active signal and a row hammer refresh signal, combine an active address, a row hammer address and a refresh address based on the refresh signal, the active signal, the row hammer refresh signal and a specific signal, and output a refresh control signal. The semiconductor device may include a core area in which a refresh operation is performed based on the refresh control signal.

BRIEF DESCRIPTION OF THE DRAWINGS

FIGS. 3 and 4 are truth tables for supporting a refresh command in the refresh control device of FIG. 2.

DETAILED DESCRIPTION

Hereinafter, a refresh control device and a semiconductor device including the same according to the present disclosure will be described below with reference to the accompanying drawings through various examples of embodiments.

Various embodiments may be directed to a refresh control device capable of preventing characteristic deterioration caused by row hammering through row hammer commands which are periodically generated, and a semiconductor device including the same.

Figure 1:
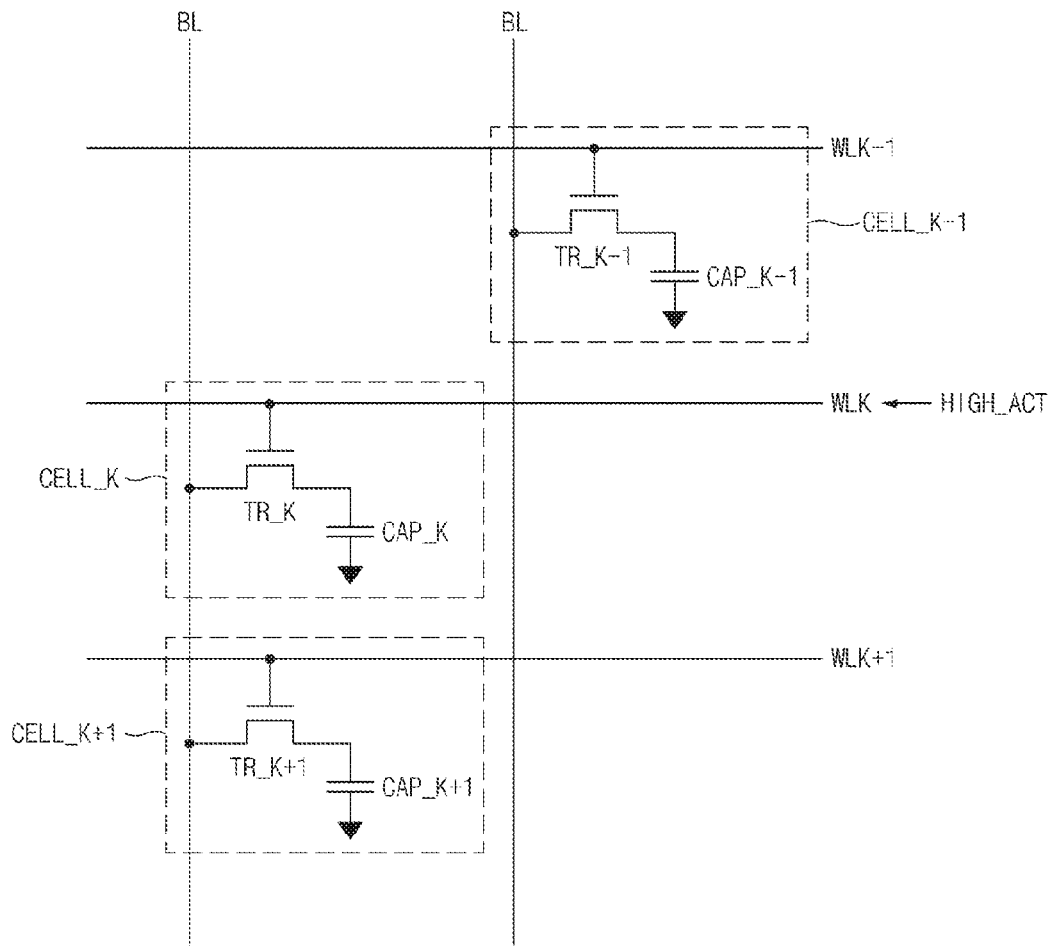
FIG. 1 is a diagram for describing word line disturbance, illustrating a part of a cell array included in a memory device.

FIG. 1 is a diagram for describing word line disturbance, illustrating a part of a cell array included in a memory device.

Referring to FIG. 1, 'BL' represents a bit line. 'WLK' represents a word line which is frequently activated, and 'WLK−1' and 'WLK+1' represent word lines adjacent to the word line WLK, that is, the word line which is frequently activated. Furthermore, 'CELL_K' represents a memory cell coupled to the word line WLK, 'CELL_K−1' represents a memory cell coupled to the word line WLK−1, and 'CELL_K+1' represents a memory cell coupled to the word line WLK+1. The memory cells include cell transistors TR_K, TR_K−1 and TR_K+1 and cell capacitors CAP_K, CAP_K−1 and CAP_K+1, respectively.

Referring to FIG. 1, when the word line WLK is activated or deactivated, a coupling effect may occur between the word line WLK and the word lines WLK−1 and WLK+1, thereby affecting charges of the cell capacitors CAP_K, CAP_K−1 and CAP_K+1 while raising or lowering the voltages of the word lines WLK−1 and WLK+1.

Thus, when the word line WLK toggles between an active state and an inactive state while the word line WLK is frequently activated, the charges of the cell capacitors CAP_K−1 and CAP_K+1 included in the memory cells CELL_K−1 and CELL_K+1 may be significantly changed, and the data of the memory cells may be deteriorated.

Furthermore, electromagnetic waves generated while a word line toggles between an active state and an inactive state may introduce electrons into the cell capacitor of a memory cell coupled to an adjacent word line or leak electrons from the cell capacitor, thereby damaging data of the memory cell.

When a specific word line (for example, WLK) is repetitively activated a predetermined number of times or more, data of memory cells coupled to the adjacent word lines (for example, WLK+1 and WLK−1) may be deteriorated. Such a phenomenon is referred to as row hammering. In order to solve the problem, an active operation may be performed on the word lines WLK+1 and WLK−1 adjacent to the word line WLK which is excessively activated.

As the active operation is performed on the adjacent word lines WLK+1 and WLK−1, the data of the memory cells coupled to the adjacent word lines WLK+1 and WLK−1 may be rewritten, which makes it possible to prevent the damage of the data.

A semiconductor device such as DRAM includes a large number of memory cells, and each of the memory cells includes a transistor serving as a switch and a capacitor for storing data. However, since a leakage current occurs due to a structural problem of the memory cell such as a PN junction of the transistor, the initial data stored in the capacitor may disappear. Thus, the semiconductor device requires a refresh operation of recharging the memory cell before the data disappear.

A normal refresh operation may include an auto refresh operation and a self refresh operation. The auto refresh operation refers to a mode in which a semiconductor device performs a refresh operation according to a refresh command applied from outside, and the self refresh operation refers to a mode in which a semiconductor device performs a refresh operation while sequentially changing an internal address according to a refresh command applied from outside.

Recently, in addition to the normal refresh operation, an additional refresh operation is performed on a row which is highly likely to lose data due to row hammering. The row hammering refers to a phenomenon in which data of memory cells coupled to a corresponding row or adjacent row are damaged because the corresponding row is frequently activated.

The refresh control device according to a present embodiment may randomize target addresses which are accessed for additional refresh operations by a plurality of oscillation circuits having difference cycles, thereby reducing a refresh fail.

Figure 2:
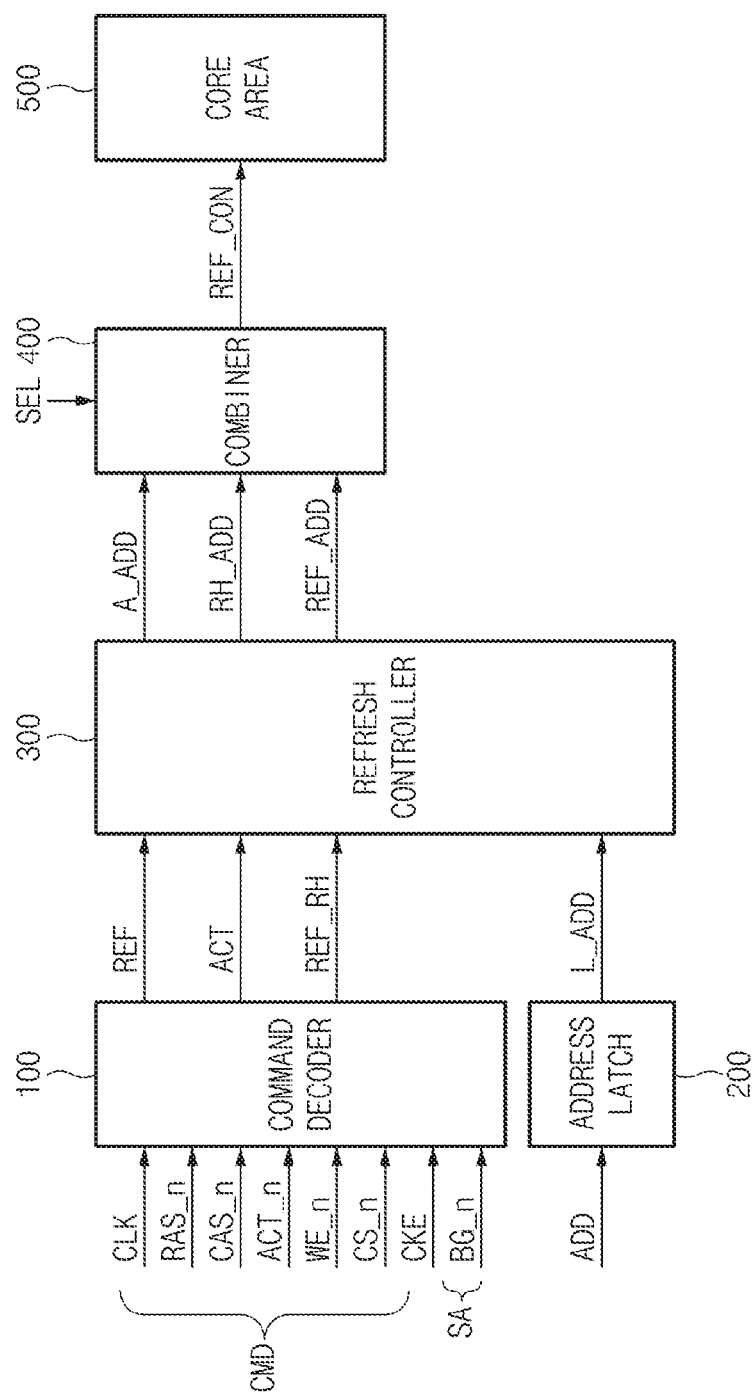
FIG. 2 is a configuration diagram illustrating a representation of an example of a refresh control device according to an embodiment.

FIG. 2 is a configuration diagram illustrating a representation of an example of the refresh control device according to a present embodiment.

The refresh control device according to a present embodiment includes a command decoder 100, an address latch 200, a refresh controller 300, a combiner 400 and a core area 500.

The command decoder 100 receives a command signal CMD. The command signal CMD may include a clock signal CLK, a row address signal (RAS signal) RAS_n, a column address signal (CAS signal) CAS_n, an active signal ACT_n, a write enable signal WE_n, a chip select signal CS_n, a clock enable signal CKE. The command decoder 100 receives a specific address. The specific address SA may include a bank group address BG_n. The command decoder 100 receives the command signal CMD and bank group address BG_n, decodes the received signals and outputs a refresh signal REF, an active signal ACT and a row hammer refresh signal REF_RH. The command decoder 100 determines the logic level of the bank group address BG_n, and selects and enables any one of the refresh signal REF and the row hammer refresh signal REF_RH.

The address latch 200 receives and latches an address ADD, and outputs a latch address L_ADD.

The refresh controller 300 outputs an active address A_ADD, a row hammer address RH_ADD and a refresh address REF_ADD in response to the refresh signal REF, the active signal ACT, the row hammer refresh signal REF_RH and the latch address L_ADD.

That is, the refresh controller 300 distinguishes between a refresh mode and a row hammer refresh mode in response to whether the refresh signal REF or the row hammer refresh signal REF_RH is enabled. The refresh controller 300 receives the active signal ACT, the refresh signal REF, the row hammer refresh signal REF_RH and the latch address L_ADD, and generates the active address A_ADD, the row hammer address RH_ADD and the refresh address REF_ADD.

When the refresh signal REF is enabled, the refresh controller 300 determines that the corresponding mode is the refresh mode, and enables the refresh address REF_ADD. When the row hammer refresh signal REF_RH is enabled, the refresh controller 300 determines that the corresponding mode is the row hammer refresh mode, and enables the row hammer refresh signal REF_RH. When the active signal ACT is enabled, the refresh controller 300 determines that the current mode is the active mode, enables the active address A_ADD, and receives the latch address L_ADD.

The combiner 400 selects any one of the active address A_ADD, the row hammer address RH_ADD and the refresh address REF_ADD in response to a select signal SEL, and outputs the selected signal as a refresh control signal REF_CON.

That is, when the active signal ACT is enabled in response to the select signal SEL, the combiner 400 selects the active address A_ADD and outputs the selected signal as the refresh control signal REF_CON. When the refresh signal REF is enabled in response to the select signal SEL, the combiner 400 selects the refresh address REF_ADD and outputs the selected signal as the refresh control signal REF_CON. When the row hammer refresh signal REF_RH is enabled in response to the select signal SEL, the combiner 400 selects the row hammer address RH_ADD and outputs the selected signal as the refresh control signal REF_CON.

The select signal SEL may be generated by a combined signal of the refresh signal REF, the row hammer refresh signal REF_RH and the active signal ACT.

In the core area 500, a corresponding word line is activated in response to the refresh control signal REF_CON, and a refresh operation is performed.

As the technology of semiconductor devices shrinks and the pitch between adjacent word lines is gradually reduced, row hammering occurs which degrades the refresh characteristic and causes data loss. That is, "row hammering" refers to a phenomenon that, when only a specific row line is continuously activated and precharged, a refresh fail occurs in upper and lower word lines adjacent to the target word line, and cell data of the adjacent word lines are lost.

In order to prevent the row hammering, "smart refresh" may be performed as follows. When a user repetitively activates and precharges a word line of a specific address, a specific row line which is repetitively activated is sampled, and the address thereof is stored. Then, when the next refresh command is applied, upper and lower word lines adjacent to the specific row line are refreshed through an adder-subtracter.

As memory devices (for example, DRAM) are scaled down, data loaded on rows ((N+1)th and (N−1)th lines) around an accessed specific row (Nth line) may be lost. That is, row hammering may occur. In order to solve the problem, an address ADD inputted in response to the active signal ACT is latched. Then, in order to prevent row hammering, the refresh signal REF is enabled to perform a refresh operation of a row line adjacent to the latch address L_ADD.

FIGS. 3 and 4 are truth tables for supporting a refresh command in the refresh control device of FIG. 2.

FIG. 3 illustrates a refresh command truth table during a normal refresh operation. Referring to FIG. 3, the upper row represents supported functions, and the lower row represents the values of signals indicating the functions.

Referring to FIG. 3, the refresh signal REF is enabled during a normal refresh operation.

That is, during the normal refresh operation, the RAS signal RAS_n has a logic low level 'L', the CAS signal CAS_n has a logic low level 'L', the active signal ACT_n has a logic high level 'H', the write enable signal WE_n has a logic high level 'H', the chip select signal CS_n has a logic low level 'L', and the clock enable signal CKE has a logic high level 'H', when the signals are inputted to the command decoder 100.

Furthermore, the bank addresses BA (for example, BA0 and BA1), the column addresses C (for example, C0, C1 and C2), a burst chop address BC (for example, BC_n), an auto-precharge signal AP and the addresses ADD (for example, A0 to A13 and A17) are applied as valid level signals V because a refresh counter is used.

The bank group address BG is inputted at a logic high level. During general refresh operations of all banks, the bank group address BG (i.e., BG0-BG1), is applied as a valid level signal V.

In the present embodiment, however, the bank group address BG inputted to the command decoder 100 has a logic high level, in order to determine whether the corresponding mode is the normal refresh mode or the row hammer refresh mode. That is, when the bank group address BG is at a logic high level, the command decoder 100 enables the refresh signal REF and operates in the normal refresh mode.

In a present embodiment, bank group addresses BG0 and BG1 are applied. When the bank group addresses BG0 and BG1 are applied, four bank groups may be included. In the present embodiments, however, the number of bank groups are not limited, but can be changed to various values.

FIG. 4 is a refresh command truth table during the row hammer refresh operation. Referring to FIG. 4, the upper row represents supported functions, and the lower row represents the values of signals indicating the functions.

Referring to FIG. 4, the row hammer refresh signal REF_RH is enabled during the row hammer refresh operation.

During the row hammer refresh operation, the RAS signal RAS_n has a logic low level 'L', the CAS signal CAS_n has a logic low level 'L', the active signal ACT_n has a logic high level 'H', the write enable signal WE_n has a logic high level 'H', the chip select signal CS_n has a logic low level 'L', and the clock enable signal CKE has a logic high level 'H', when the signals are inputted to the command decoder 100.

The bank group address BG is inputted at a logic low level (i.e., BG0-BG1). Furthermore, the bank addresses BA (for example, BA0 and BA1), the column addresses C (for example, C0, C1 and C2), the addresses ADD (for example, A0 to A13 and A17), a burst chop address BC (for example, BC_n) and an auto-precharge signal AP are applied as valid level signals V because the refresh counter is used.

In a general refresh truth table, the address bits of the bank group address BG are retained as valid level values V, and used as meaningless values. In a present embodiment, however, the bank group address BG is used to distinguish the row hammer operation.

For example, when the bank group address BG is inputted at a logic high level, the command decoder 100 according to a present embodiment determines that the corresponding mode is the normal refresh mode, and enables the refresh signal REF. Furthermore, when the bank group address BG is inputted at a logic low level (i.e., BG0-BG1), the bank group address BG determines that the corresponding mode is the row hammer refresh mode, and enables the row hammer refresh signal REF_RH.

Although the refresh command truth table according to a present embodiment is configured as illustrated in FIG. 4, this is only an example for a memory device. The logic levels of the refresh command truth table can be changed depending on the specification. For example, in a present embodiment, the bank group address BG is used as an address for distinguishing between the normal refresh mode and the row hammer refresh mode. However, this is only an example, and another address or signal may be used as a refresh mode determination signal.

Figure 5:
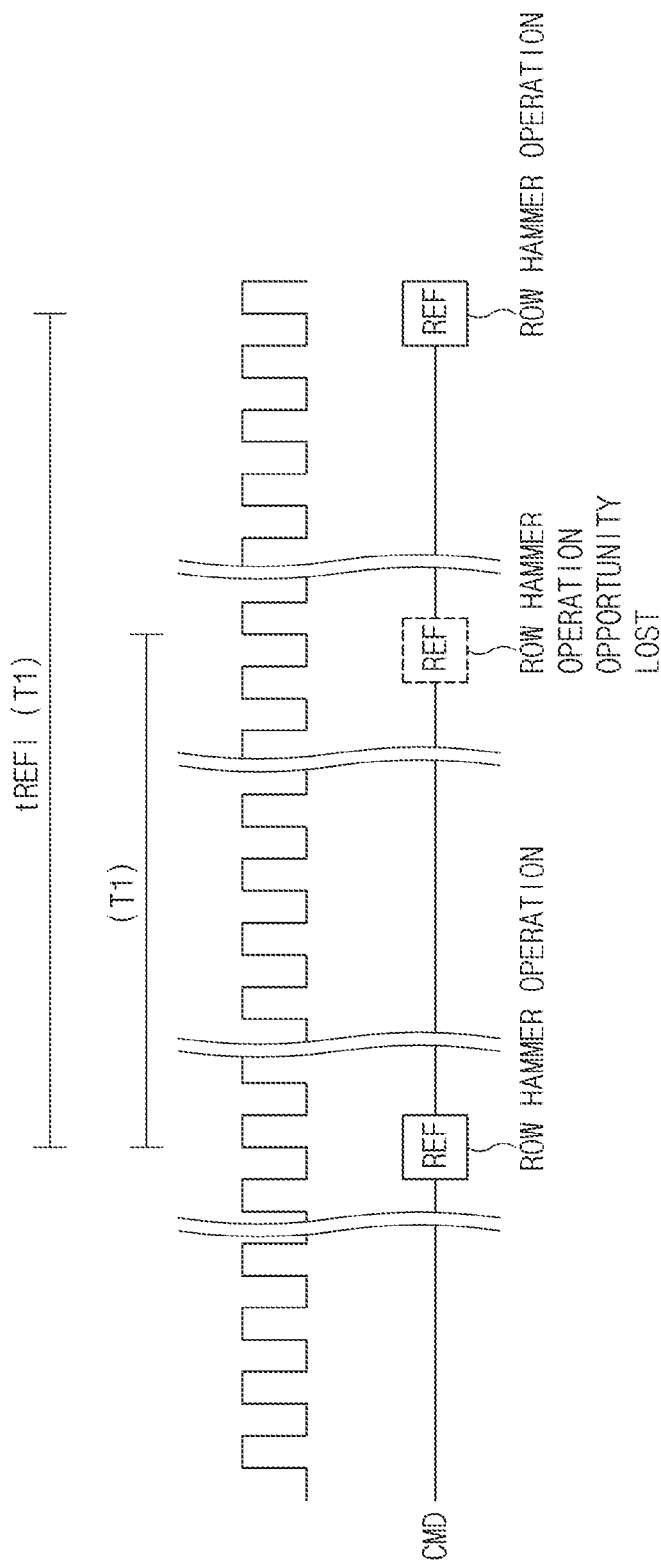
FIGS. 5 and 6 are timing diagrams for describing the operation of the refresh control device according to an embodiment of FIG. 2.
Figure 6:
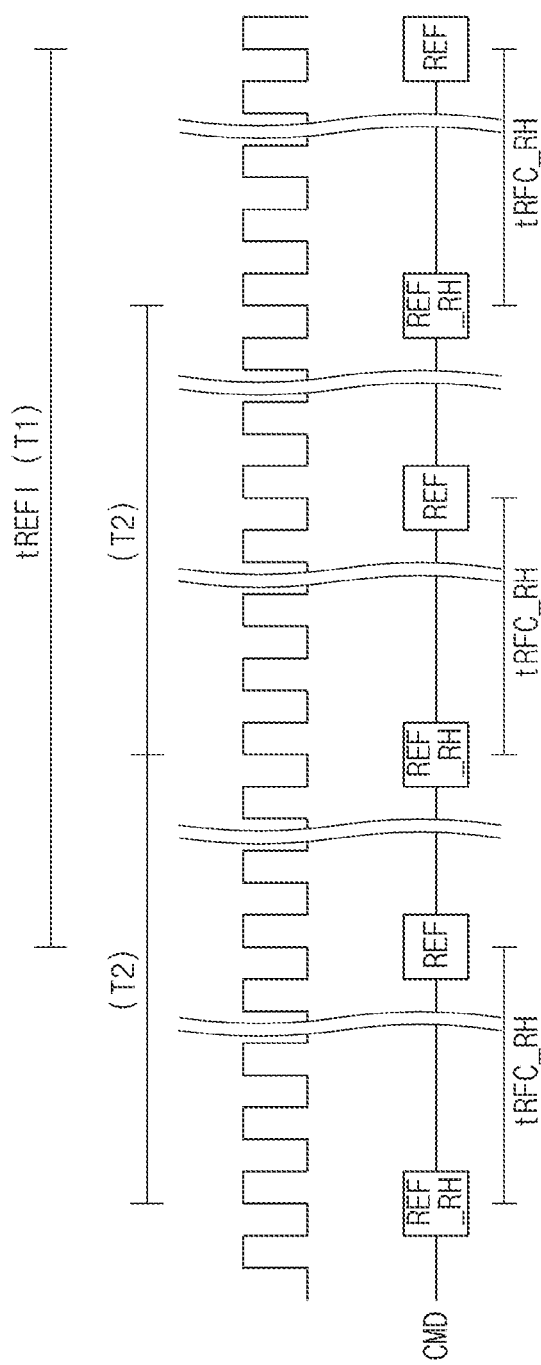

FIGS. 5 and 6 are timing diagrams for describing the operation of the refresh control device according to an embodiment of FIG. 2.

FIG. 5 illustrates that a row hammer refresh operation is performed by a refresh signal REF that is, for a normal refresh, or a normal refresh signal REF, instead of the row hammer refresh signal REF_RH. The row hammer refresh operation is performed at a timing that the normal refresh signal REF is enabled.

An external controller may reduce the number of times that the refresh command is enabled, in order to minimize the refresh operations of the memory device. That is, in order to reduce current consumption, the controller monitors the internal temperature of the memory device, using the characteristic that the refresh characteristic is changed with a temperature change. For example, under the condition that the temperature falls, the controller may decrease the number of times that the refresh command is enabled (increase the refresh interval), and transfer the refresh command to the memory device.

Then, the cycle tREFI that the refresh signal REF is inputted becomes larger than a preset refresh cycle (for example, 7.8 µs) T1. In this case, as the number of row hammer refresh operations is reduced, row hammering may occur.

FIG. 6 illustrates that both a refresh signal REF that is normal or normal refresh signal REF and the row hammer refresh signal REF_RH are used to perform the row hammer refresh operation. The row hammer refresh operation is performed at a timing that the normal refresh signal REF is enabled. The normal refresh signal REF is enabled at each cycle T1.

Here, one cycle T2 of the row hammer refresh signal REF_RH may be set to a shorter cycle than one cycle T1 of the normal refresh signal REF. Furthermore, a period from the point of time that the row hammer refresh signal REF_RH is inputted to the point of time that the normal refresh signal REF is inputted is defined as tRFC_RH.

Here, tREFI represents an interval at which the refresh signal REF is enabled (refresh operation period). Furthermore, tRFC represents a time required until an active cycle is started (refresh row cycle time), that is, a minimum of time required for activating and precharging a word line during the refresh operation.

Furthermore, tRFC_RH represents a minimum of time required when the row hammer refresh command is inputted. That is, the normal refresh signal REF may be inputted at tRFC_RH after the row hammer refresh signal REF_RH is inputted.

Then, the row hammer refresh operation is performed at a timing that the row hammer refresh signal REF_RH is enabled. The row hammer refresh signal REF_RH is successively activated at a predetermined cycle T2.

Even when the cycle tREFI at which the refresh signal REF is inputted is larger than the preset refresh cycle (for example, 7.8 μs) T1, a row hammer refresh operation may be performed according to the row hammer refresh signal REF_RH having a short cycle. That is, regardless of the cycle tREFI of the refresh signal REF, the row hammer refresh operation may be performed whenever the row hammer refresh signal REF_RH is inputted, which may make it possible to increase the number of times that the row hammer refresh operation is performed.

Figure 7:
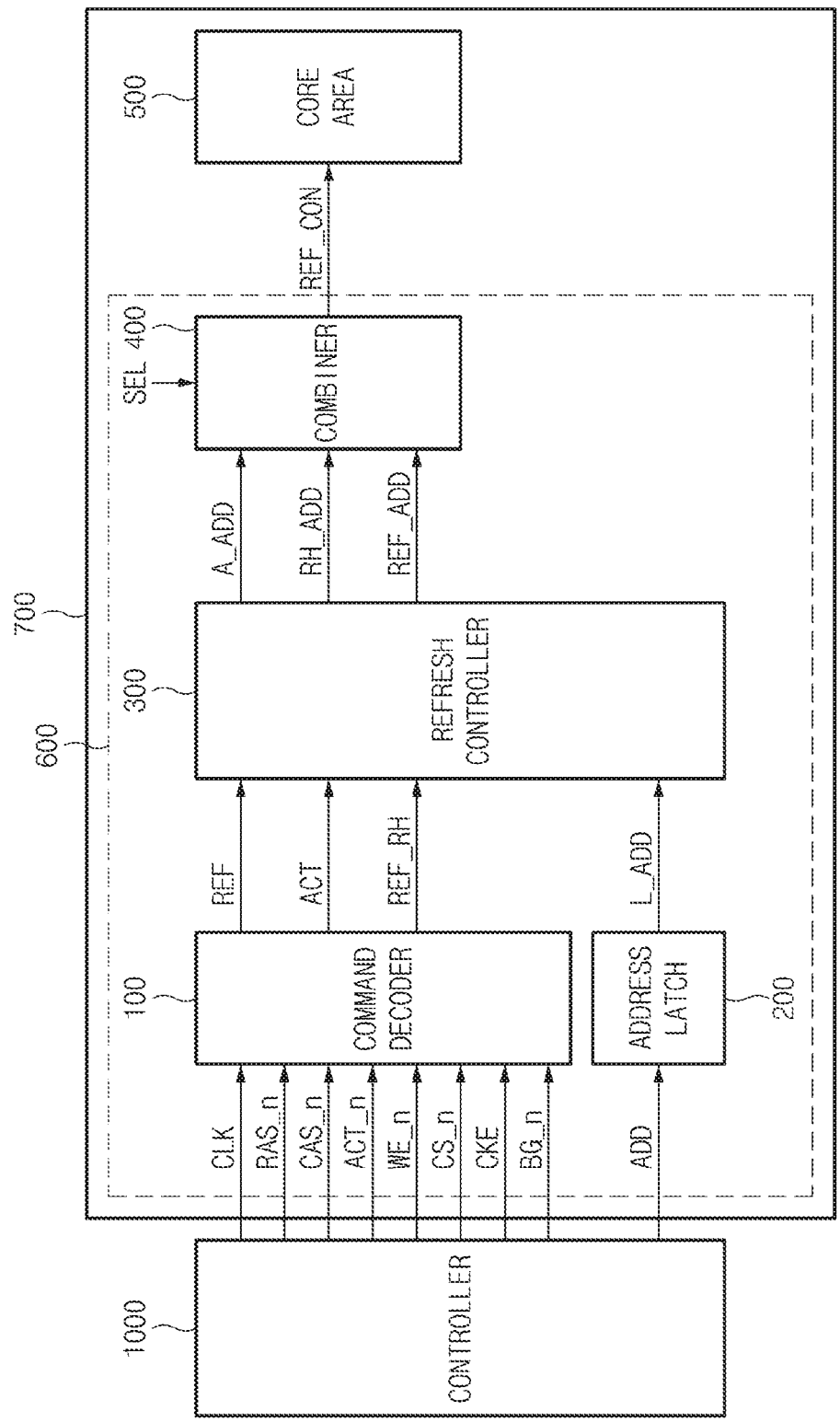
FIG. 7 is a configuration diagram illustrating a representation of an example of a system including a semiconductor device according to an embodiment.

FIG. 7 is a configuration diagram illustrating a representation of an example of a system including a semiconductor device according to an embodiment.

The system of FIG. 7 includes a semiconductor device 700 and a controller 1000. The semiconductor device 700 includes the refresh control device 600 and the core area 500 which are illustrated and discussed with regards to FIGS. 1 to 6. For brevity, duplicate descriptions will be omitted herein with regards to the refresh control device 600 and the core area 500.

As such, the clock signal CLK, the RAS signal RAS_n, the CAS signal CAS_n, the active signal ACT_n, the write enable signal WE_n, the chip select signal CS_n, the clock enable signal CKE, the bank group address BG_n and other addresses, which are inputted to the command decoder 100 of the refresh control device 600, may be applied from the controller 1000 outside the semiconductor device 700. Similarly, an address ADD inputted to the address latch 200 may be generated from the controller 1000 outside the semiconductor device 700.

According to a present embodiment, the refresh control device may prevent characteristic deterioration caused by row hammering through row hammer commands which are periodically generated, thereby reducing power consumption.

While certain embodiments have been described above, it will be understood to those skilled in the art that the embodiments described are by way of example only. Accordingly, the semiconductor devices or refresh control devices described herein should not be limited based on the described embodiments. Rather, the semiconductor devices or refresh control devices described herein should only be limited in light of the claims that follow when taken in conjunction with the above description and accompanying drawings.

What is claimed is:

1. A refresh control device comprising:
a command decoder configured to decode a command signal and a specific address, and output a refresh signal, an active signal and a row hammer refresh signal;
a refresh controller configured to output an active address, a row hammer address and a refresh address based on the refresh signal, the active signal, the row hammer refresh signal and a latch address; and
a combiner configured to combine the active address, the row hammer address and the refresh address, and output a refresh control signal.

2. The refresh control device of claim 1, wherein the command decoder receives and decodes the specific address and one or more command signals of a clock signal, a row address signal (RAS signal), a column address signal (CAS signal), an active signal, a write enable signal, a chip select signal and a clock enable signal.

3. The refresh control device of claim 1, wherein the command decoder enables any one of the refresh signal and the row hammer refresh signal based on a logic level of a bank group address.

4. The refresh control device of claim 1, wherein the specific address comprises a bank group address.

5. The refresh control device of claim 1, wherein when the refresh signal is enabled, the refresh controller determines that the corresponding mode is a refresh mode, and enables the refresh address, and
when the row hammer refresh signal is enabled, the refresh controller determines that the corresponding mode is a row hammer refresh mode, and enables the row hammer address,
when the active signal is enabled, the refresh controller determines that the corresponding mode is an active mode, and enables the active address.

6. The refresh control device of claim 1, wherein the refresh controller enables the refresh address based on the refresh signal when a bank group address has a first logic level, and enables the row hammer address based on the row hammer refresh signal when the bank group address has a second logic level.

7. The refresh control device of claim 1, wherein the combiner selects any one of the active address, the row hammer address and the refresh address, and outputs the selected signal as the refresh control signal.

8. The refresh control device of claim 1, wherein the combiner selects any one of the active address, the row hammer address, and the refresh address based on a select signal, and outputs the selected signal as the refresh control signal.

9. The refresh control device of claim 1, wherein a refresh operation by the row hammer address and a refresh operation by the refresh address have different operation cycles.

10. The refresh control device of claim 1, wherein a refresh cycle by the row hammer address is shorter than a refresh cycle by the refresh address.

11. The refresh control device of claim 1, further comprising an address latch configured to latch an address and output the latch address.

12. A semiconductor device comprising:
a refresh control device configured to decode a command signal to output a refresh signal, an active signal and a row hammer refresh signal, combine an active address, a row hammer address and a refresh address based on the refresh signal, the active signal, the row hammer refresh signal and a specific address, and output a refresh control signal; and
a core area in which a refresh operation is performed based on the refresh control signal.

13. The semiconductor device of claim 12, wherein the refresh control device comprises:
a command decoder configured to decode the command signal and the specific address, and output the refresh signal, the active signal and the row hammer refresh signal;
an address latch configured to latch an address and output the latch address;
a refresh controller configured to output the active address, the row hammer address and the refresh address based on the refresh signal, the active signal, the row hammer refresh signal and the latch address; and
a combiner configured to combine the active address, the row hammer address and the refresh address, and output a refresh control signal.

14. The refresh control device of claim 13, wherein the combiner selects any one of the active address, the row hammer address, and the refresh address based on a select signal, and outputs the selected signal as the refresh control signal.

15. The semiconductor device of claim 13, wherein the command decoder receives and decodes the specific address and one or more command signals of a clock signal, a row address signal (RAS signal), a column address signal (CAS signal), an active signal, a write enable signal, a chip select signal and a clock enable signal.

16. The semiconductor device of claim 13, wherein the command decoder enables any one of the refresh signal and the row hammer refresh signal based on a logic level of a bank group address.

17. The semiconductor device of claim 13, wherein when the refresh signal is enabled, the refresh controller determines that the corresponding mode is a refresh mode, and enables the refresh address, and when the row hammer refresh signal is enabled, the refresh controller determines that the corresponding mode is a row hammer refresh mode, and enables the row hammer address, when the active signal is enabled, the refresh controller determines that the corresponding mode is an active mode, and enables the active address.

18. The semiconductor device of 13, wherein the specific address comprises a bank group address.

19. The semiconductor device of claim 18, wherein the refresh controller enables the refresh address based on the refresh signal when a bank group address has a first logic level, and enables the row hammer address based on the row hammer refresh signal when the bank group address has a second logic level.

20. The semiconductor device of claim 12, wherein in the core area, a refresh operation by the row hammer address and a refresh operation by the refresh address have different operation cycles.

* * * * *